(12) United States Patent
Fukumasu et al.

(10) Patent No.: US 9,906,158 B2
(45) Date of Patent: Feb. 27, 2018

(54) POWER CONVERSION DEVICE

(71) Applicant: HITACHI AUTOMOTIVE SYSTEMS, LTD., Hitachinaka-shi, Ibaraki (JP)

(72) Inventors: Keisuke Fukumasu, Tokyo (JP); Masayoshi Takahashi, Tokyo (JP); Hideyuki Sakamoto, Ibaraki (JP)

(73) Assignee: Hitachi Automotive Systems, Ltd., Ibaraki (JP)

( * ) Notice: Subject to any disclaimer, the term of this patent is extended or adjusted under 35 U.S.C. 154(b) by 0 days.

(21) Appl. No.: 15/321,238

(22) PCT Filed: Jun. 17, 2015

(86) PCT No.: PCT/JP2015/067436
§ 371 (c)(1),
(2) Date: Dec. 22, 2016

(87) PCT Pub. No.: WO2016/017311
PCT Pub. Date: Feb. 4, 2016

(65) Prior Publication Data
US 2017/0194872 A1    Jul. 6, 2017

(30) Foreign Application Priority Data

Jul. 29, 2014   (JP) ................................ 2014-154101

(51) Int. Cl.
*H05K 5/00*       (2006.01)
*H02M 7/00*       (2006.01)
(Continued)

(52) U.S. Cl.
CPC .......... *H02M 7/003* (2013.01); *H02M 7/537* (2013.01); *H05K 5/0017* (2013.01); *H05K 5/0026* (2013.01); *H05K 5/04* (2013.01)

(58) Field of Classification Search
CPC .. B60L 11/14; B60L 2200/26; B60L 2210/40; H02B 1/20; H02M 1/00;
(Continued)

(56) References Cited

U.S. PATENT DOCUMENTS

2005/0185381 A1* 8/2005 Ono ....................... H05K 5/061
361/715
2011/0261588 A1   10/2011 Hattori et al.
(Continued)

FOREIGN PATENT DOCUMENTS

JP      2011-001869 A    1/2011
JP      2012-152104 A    8/2012
(Continued)

*Primary Examiner* — Timothy Thompson
*Assistant Examiner* — Guillermo Egoavil
(74) *Attorney, Agent, or Firm* — Volpe and Koenig, P.C.

(57) ABSTRACT

A power conversion device possesses a capacitor module, a power module, a circuit board on which a control circuit is mounted and which has a ground layer formed in a control circuit mounting region, a noise shielding plate, and a metal housing. The circuit board is above the capacitor module, and the noise shielding plate faces the control circuit mounting region between the circuit board and the capacitor module, in which the noise shielding plate has a plurality of connection parts to be electrically connected to the metal housing. A first end part on the power module side of the noise shielding plate is on the power module side more than a second end part on the power module side of the ground layer, and the connection part which is the closest to the first end part is provided on the power module side more than the second end part.

1 Claim, 8 Drawing Sheets

(51) Int. Cl.
*H02M 7/537* (2006.01)
*H05K 5/04* (2006.01)

(58) Field of Classification Search
CPC .......... H02M 1/14; H02M 1/44; H02M 7/003; H02M 7/537; H02P 27/06; H02P 29/60; H05K 5/04; H05K 5/0017; H05K 5/061; H05K 5/0026; H05K 7/209; H05K 7/1432; H05K 7/20218; H05K 7/20909; H05K 7/20927; H05K 9/0015; H01L 23/36; H01L 23/473; H01L 23/3736; H01L 24/36; H01L 24/40; H01L 2224/33; H01L 2224/40137; H01L 2224/48091; H01L 2224/48247; H01L 2224/73265; H01L 2924/181; H01L 2924/13055; H01L 2924/13091; Y02T 10/70; Y02T 10/7077; Y02T 10/7241
USPC ............. 312/223.1; 361/699, 715, 752, 818; 363/141
See application file for complete search history.

(56) References Cited

U.S. PATENT DOCUMENTS

| | | | |
|---|---|---|---|
| 2012/0188712 A1* | 7/2012 | Ishibashi | H02M 7/003 361/688 |
| 2013/0088128 A1 | 4/2013 | Nakano et al. | |
| 2014/0098588 A1* | 4/2014 | Kaneko | H02M 7/003 363/141 |
| 2014/0160823 A1* | 6/2014 | Uetake | H02M 7/003 363/141 |
| 2014/0248731 A1* | 9/2014 | Huang | B81B 7/0064 438/50 |
| 2015/0163961 A1 | 6/2015 | Hara et al. | |
| 2016/0268782 A1* | 9/2016 | Fujita | H02B 1/20 |

FOREIGN PATENT DOCUMENTS

| | | |
|---|---|---|
| JP | 2014-072938 A | 4/2014 |
| WO | 2012/056735 A1 | 5/2012 |

\* cited by examiner

FIG. 4
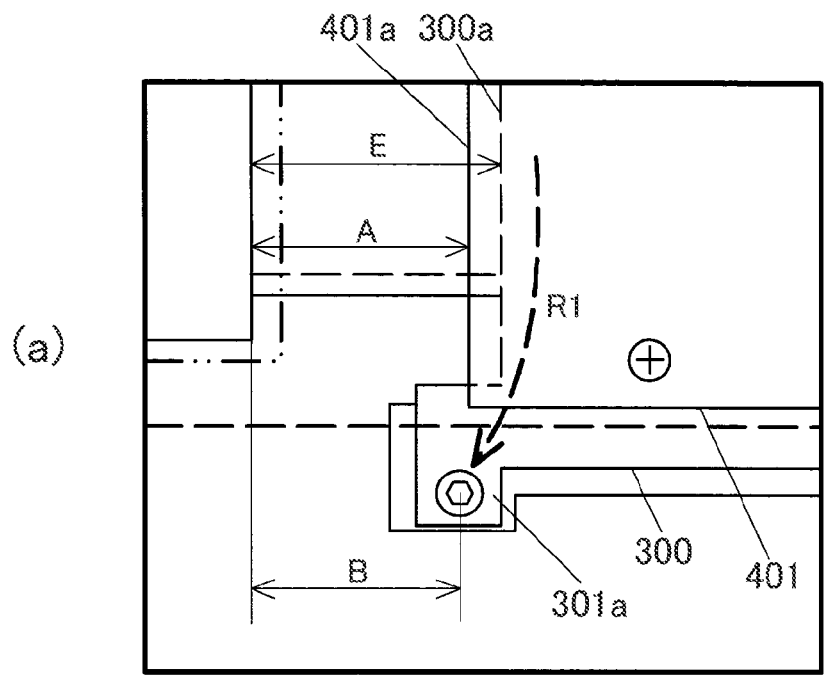
(a)
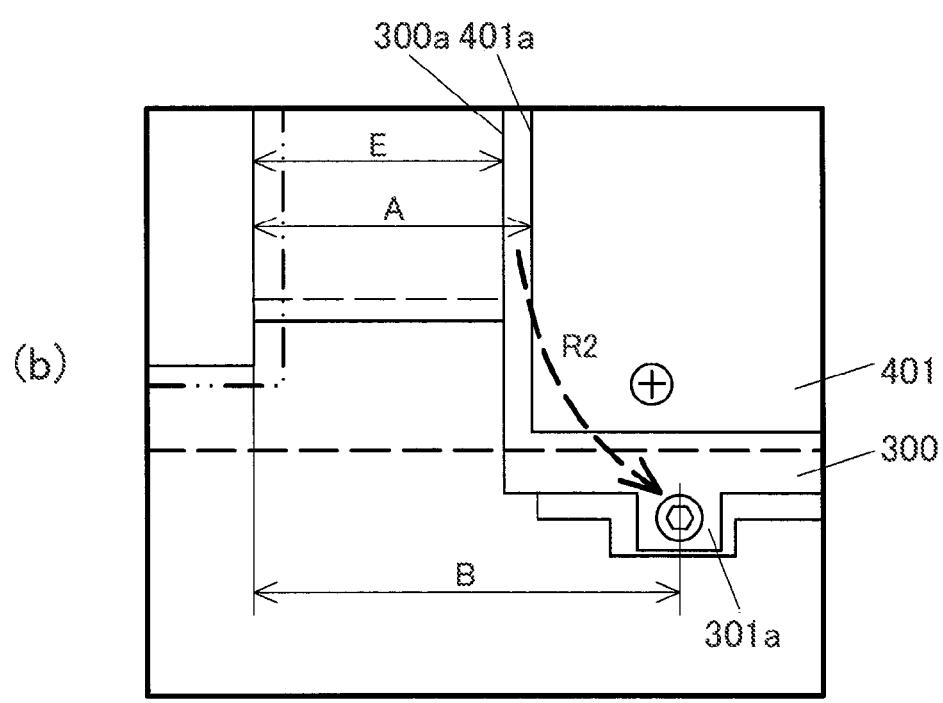
(b)

POWER CONVERSION DEVICE

TECHNICAL FIELD

The present invention relates to a power conversion device.

BACKGROUND ART

In the power conversion device, a DC current is converted into an AC current by performing switching by a power semiconductor. The power conversion device possesses a power module which possesses a plurality of power semiconductors, a capacitor module to be connected to a DC bus bar between a DC power source and the power module in parallel with the power module, a drive circuit part which drives the power semiconductors, and a control circuit part which outputs a switching control signal to the drive circuit part and so forth, and these are contained in a metal housing (for example, see Patent Literature 1). In the power conversion device, a heavy electricity system (the power module, the drive circuit part, the capacitor module and so forth) and a light electricity system (the control circuit part) are contained in the same housing in this way.

As described above, since the power semiconductor switches high voltage, electromagnetic noise generates with switching. Therefore, in a conventional power conversion device, a member (a metal plate) which shields the electromagnetic noise to the control circuit part is provided in order to reduce conduction noise to a power supply source of the light electricity system.

CITATION LIST

Patent Literature

Patent Literature 1: Japanese Unexamined Patent Application Publication No. 2012-152104

SUMMARY OF INVENTION

Technical Problem

Incidentally, in power conversion devices to be loaded on electrically driven vehicles such as a hybrid vehicle, an electric vehicle and so forth, miniaturization of the devices is requested. Also a distance between a noise source and the control circuit part is made small and also an arrangement space of the noise shielding member is restrained with miniaturization. Therefore, noise shielding becomes insufficient and the conduction noise becomes a problem.

Solution to Problem

According to an aspect of the present invention, the power conversion device possesses a capacitor module which smooths a DC current from a DC power source, a power module which converts the DC current into an AC current on the basis of a drive signal from a drive circuit, a circuit board on which a control circuit which outputs a control signal for generating the drive signal is mounted and which has a ground layer formed in a control circuit mounting region, a noise shielding plate which shields noise from the power module, and a metal housing in which the capacitor module and the power module are contained side by side, the circuit board is contained above the capacitor module, and the noise shielding plate is contained at a position which faces the control circuit mounting region between the circuit board and the capacitor module, in which the noise shielding plate has a plurality of connection parts to be electrically connected to the metal housing, and a first end part on the power module side of the noise shielding plate is provided on the power module side more than a second end part on the power module side of the ground layer, and the connection part which is the closest to the first end part among the plurality of connection parts is provided on the power module side more than the second end part, in planar view viewed from above a containing part of the metal housing.

Advantageous Effect of the Invention

According to the present invention, the conduction noise which flows out of the power conversion device can be reduced.

BRIEF DESCRIPTION OF DRAWINGS

FIGS. 4(a) and 4(b) are diagrams showing comparative examples relative to a configuration shown in FIG. 3.

DESCRIPTION OF EMBODIMENTS

In the following, modes for carrying out the present invention will be described with reference to the drawings. Although in the following, a power conversion device to be loaded on the electrically drive vehicles such as the electric vehicle, the hybrid vehicle and so forth will be described by way of example, the power conversion device of the present invention can also be applied to a power conversion device used in an ordinary industrial power supply system, not limited to the on-vehicle one.

Figure 1:
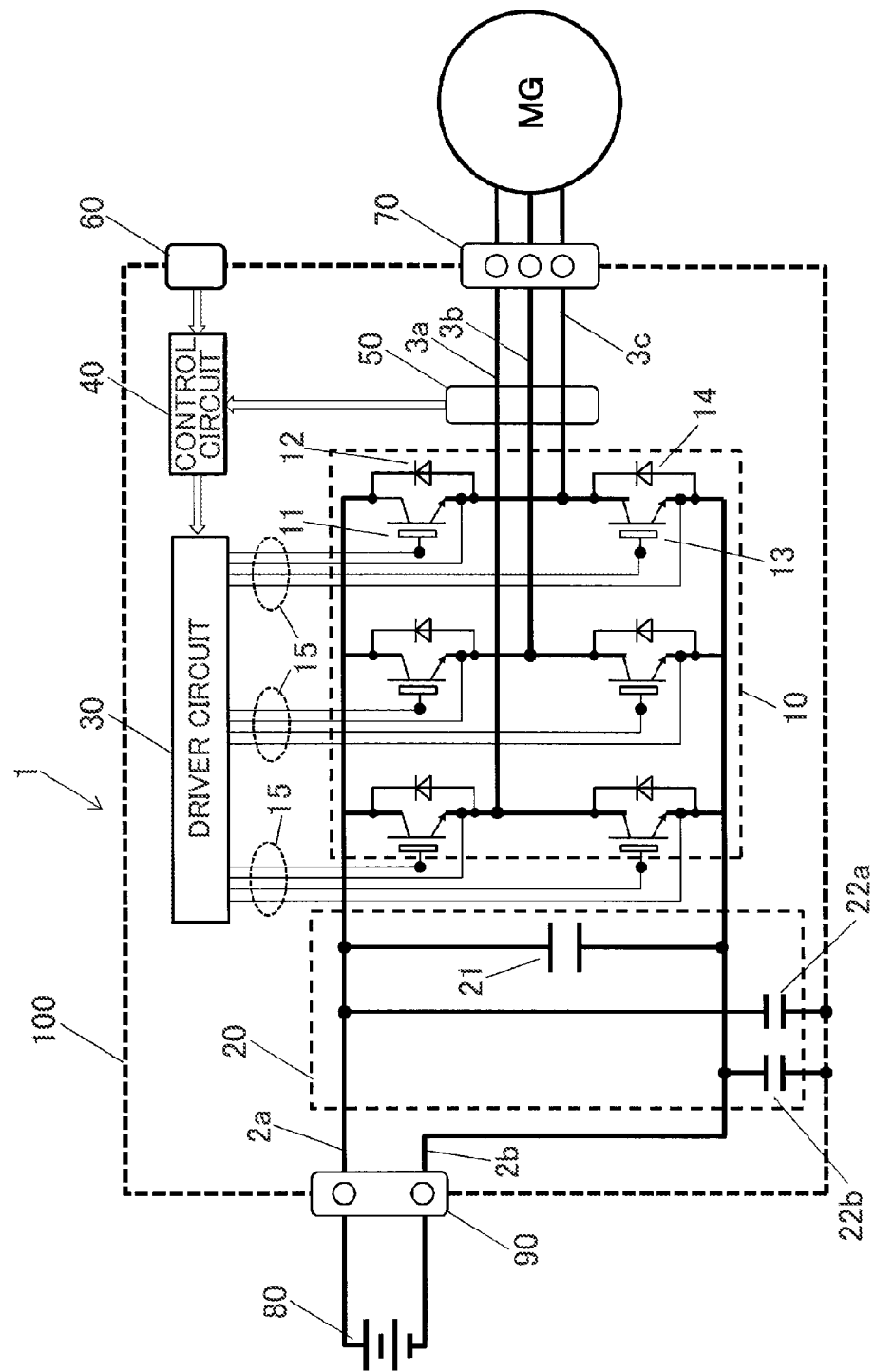
FIG. 1 is a block diagram showing one embodiment of a power conversion device according to the present invention.

FIG. 1 is a block diagram showing one embodiment of the power conversion device according to the present invention. The power conversion device 1 converts a DC current supplied from a battery 80 which is a DC power source into an AC current and supplies it to a rotating electric machine MG. In addition, the rotating electric machine MG operates as a generator upon regeneration, and the power conversion device 1 converts the AC current from the rotating electric machine MG into the DC current and charges the battery 80.

The power conversion device 1 possesses a power module 10, a capacitor module 20, a driver circuit 30, a control circuit 40 and so forth, and a housing 100 which contains them. DC bus bars 2a, 2b provided in the power conversion device 1 are connected to a DC connector 90 at one ends and are connected to the power module 10 at the other ends. The battery 80 is connected to the DC connector 90. The capacitor module 20 possesses a capacitor 21 which smooths the DC current, a capacitor 22a to be connected to the DC bus bar 2a and a housing ground terminal, and a capacitor 22b to be connected to the DC bus bar 2b and the housing ground terminal. The capacitors 22a, 22b work so as to release common mode noise to the ground.

The power module 10 possesses a plurality of switching power semiconductors 11, 13 which configure an inverter circuit. In the present embodiment, an insulated gate type bipolar transistor is used as the switching power semiconductor and will be denoted as the IGBT for short hereinafter. Three sets of series circuits of the IGBT 11 and the IGBT 13 are provided on the power module 10 in correspondence with alternate currents of three phases of a U-phase, a V-phase and a W-phase. Diodes 12, 14 are respectively parallel-connected to the IGBTs 11, 13. Incidentally, as the switching power semiconductor, a metal oxide semiconductor-type field effect transistor (denoted as the MOSFET for short hereinafter) may be used. In that case, the diodes 12, 14 become unnecessary.

One ends of corresponding AC bus bars 3a, 3b, 3c are connected between the IGBT 11 and the IGBT 13 in each series circuit. The other ends of the respective bus bars 3a, 3b, 3c are connected to an AC connector 70 to which the rotating electric machine MG is to be connected. The currents flowing through the AC bus bars 3a, 3b, 3c are detected by a current sensor 50.

The control circuit 40 possesses a microcomputer (hereinafter, described as a "Micon") adapted to arithmetically process a switching timing of the IGBTs 11, 13. A target torque value which is requested to the rotating electric machine MG1 is input into the control circuit 40 from a not shown host controller via a connector for signal 60. The control circuit 40 generates control pulses which are control signals for controlling the IGBTs 11, 13 on the basis of the target torque value which has been input from the host controller, current information from the current sensor 50, and a magnetic pole position of a rotor of the rotating electric machine MG and inputs them into the driver circuit 30. Incidentally, the magnetic pole position is the one which is detected on the basis of a detection signal which has been output from a rotating magnetic pole sensor (not shown) such as a resolver provided on the rotating electric machine MG.

Wiring for gate drive signal, wiring for emitter current detection and so forth are provided on signal wiring 15 which connects together the power module 10 and the driver circuit 30. The driver circuit 30 supplies a drive pulse for controlling each of the IGBTs 11, 13 to each of the IGBTs 11, 13 via the wiring for gate drive signal on the basis of a control pulse from the control circuit 40. Each of the IGBTs 11, 13 performs a conducting or cut-off operation on the basis of the drive pulse from the driver circuit 30 and converts the DC current into a three-phase AC current.

Figure 2:
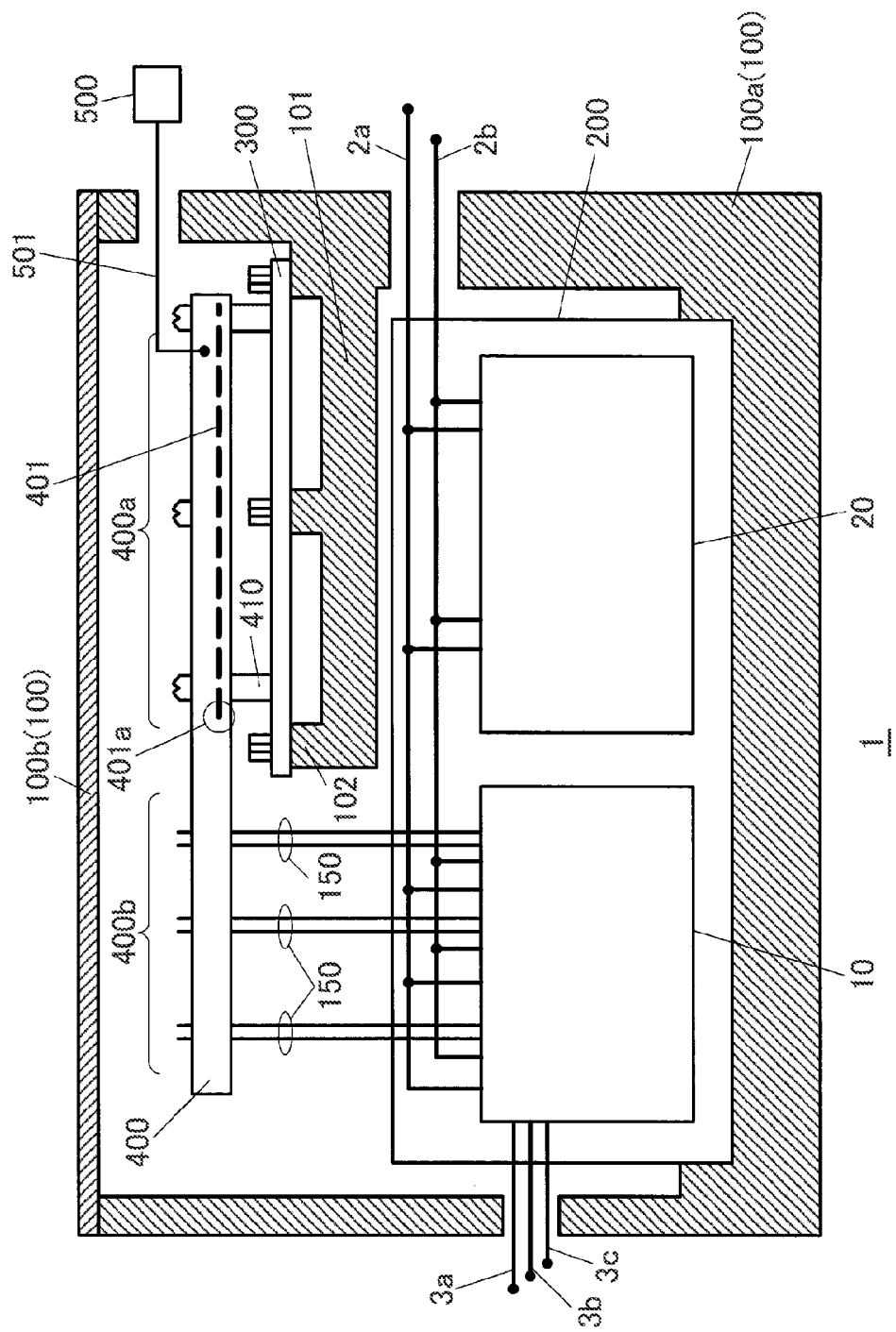
FIG. 2 is a sectional diagram having viewed a power conversion device 1 sideways.
Figure 3:
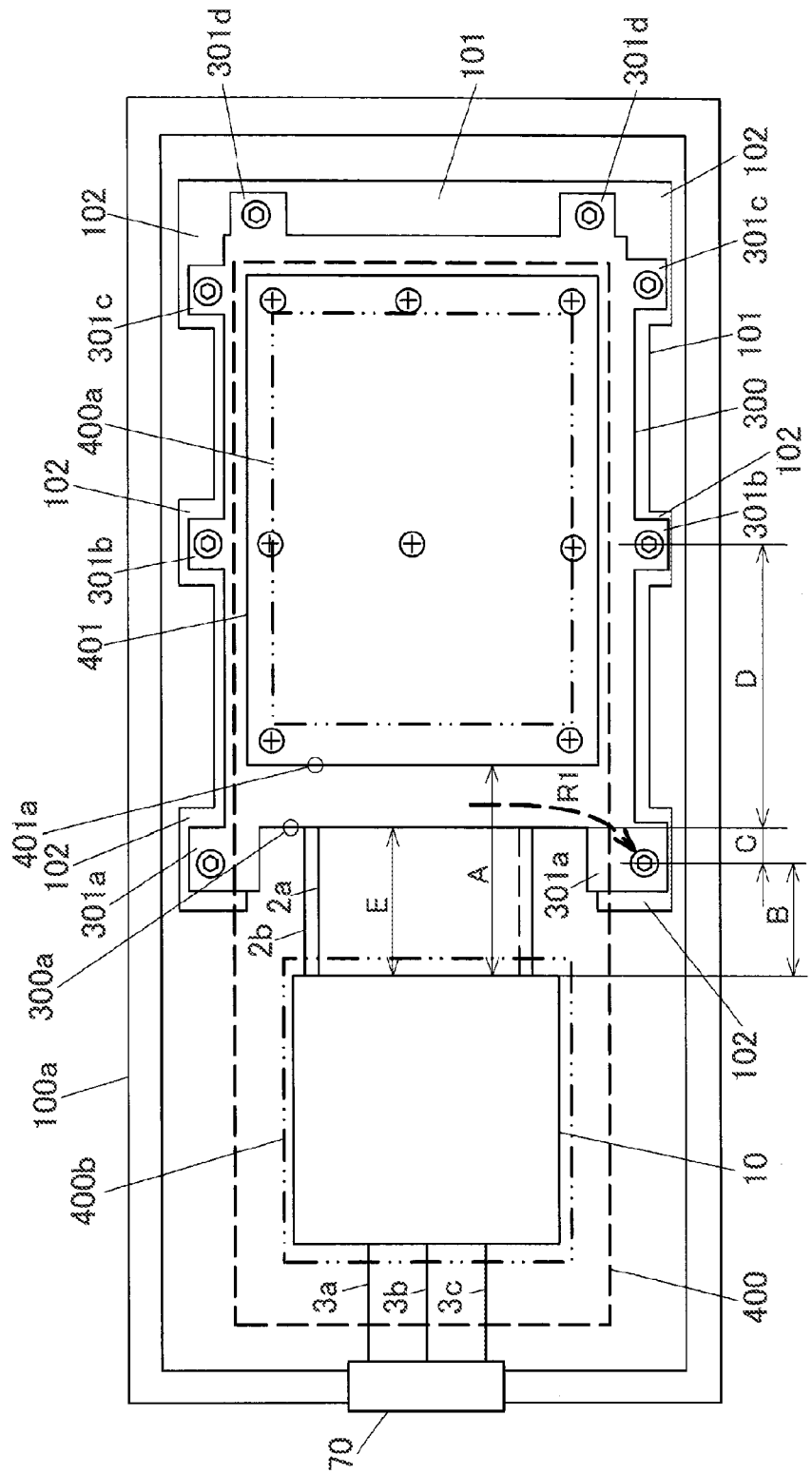
FIG. 3 is a plan view having viewed the inside of the power conversion device 1 from above the device.

FIGS. 2, 3 are schematic diagrams describing arrangement of each constitutional component in the power conversion device 1. FIG. 2 is a sectional diagram having viewed the power conversion circuit 1 sideways. The housing 100 possesses a case body 100a which contains the constitutional components, and a cover 100b which covers an upper opening of the case body 100a. The housing 100 is formed by a conductive material such as a metal and so forth (for example, an aluminum material), and serves so as to reduce emission of radiation noise from the power conversion device 1, or intrusion of the radiation noise into the power conversion device 1.

A heavy electricity unit 200 to which a DC current of several hundred volts is supplied, a metal base plate 300 for noise shielding, and the abovementioned circuit board 400 are arranged in order from the bottom face side of the case body 100a, in a containing space which is formed by the case body 100a and the cover 100b of the housing 100. The power module 10, the capacitor module 20, the DC bus bars 2a, 2b, and the AC bus bars 3a to 3c which have been described above are included in the heavy electricity unit 200. A gate terminal 150 is drawn out of the power module 10 so as to extend upward. A leading end of the gate terminal 150 is connected to gate wiring (not shown) of the circuit board 400.

In the circuit board 400 (FIG. 2), the control circuit 40 is mounted in a board region 400 a above the metal base plate 300, and the driver circuit 30 (FIG. 1) is mounted in a board region 400 b above the power module 10. In addition, a ground pattern layer 401 relating to the control circuit 40 is formed in the board region 400 a.

Since a high voltage of several hundred volts is applied from the battery 80 to the power module 10 of the power conversion device 1, and the DC current is converted into the AC current by switching that high voltage at a high speed, noise is generated from the power module 10. Therefore, the abovementioned metal base plate 300 is provided in order to prevent the noise of the heavy electricity unit 200 from coupling with the ground pattern layer 401 of the board region 400a. The noise is shielded by arranging the metal base plate 300 and conduction noise from the ground pattern layer 401 to a power supply source 500 of the light electricity system is reduced.

The metal base plate 300 is screw-fixed onto protruded parts 102 of a base plate fixing part 101 formed in the case body 100a and is electrically connected to the case body 100a. In addition, the circuit board 400 which has been arranged above the metal base plate 300 is fixed onto the metal base plate 300 via conductive supports 410. The supports 410 electrically connect together the ground pattern layer 401 of the circuit board 400 and the metal base plate 300. The case body 100a is connected to a chassis ground of a vehicle, and a potential of the metal base plate 300 which has been fixed to the case body 100a and a potential of the ground pattern layer 401 of the circuit board 400 which has been fixed to the metal base plate 300 become a potential of the chassis ground.

Incidentally, in the power conversion device 1 of the present embodiment, the control circuit 40 of the light electricity system and the driver circuit 30 of the heavy electricity system are mounted on the same circuit board 400 in order to promote miniaturization of the device. Therefore, distances between the heavy electricity unit 200, and the control circuit 40 and the metal base plate 300 are made shorter in comparison with the case of the aforementioned conventional power conversion device. Therefore, noise coupling to the metal base plate 300 becomes more noticeable and it becomes a cause for an increase in conduction noise in the ground pattern layer 401.

In addition, since connection parts of the gate terminal 150 and the power module 10 which have been described above with the DC bus bars 2a, 2b are present on an upper part of the power module 10, the metal base plate 300 cannot be extended to a part under the board region 400b. Therefore, the noise from the power module 10 is directly coupled with the ground pattern layer 401 of the circuit board 400 and causes the conduction noise to generate.

FIG. 3 is a plan view viewing the inside of the power conversion device 1 from above the device, and in regard to the circuit board 400, a board position has been shown only by a broken line for easy understanding of a positional relation among the power module 10, the metal base plate 300, and the ground pattern layer 401. Though not shown in the drawing, the capacitor module 20 is arranged under the metal base plate 300, and the capacitor module 20 and the power module 10 are connected together by the DC bus bars 2a, 2b. Each of the DC bus bars 2a, 2b is configured by a wide-width conductive plate and one pair of the conductive plates is made into a layered structure.

A plurality of connection parts 301a, 301b, 301c, 301d are formed on the metal base plate 300, and these connection parts 301a to 301d are fixed to the protruded parts 102 of the base plate fixing part 101. The noise of the power module 10 couples with the metal base plate 300 and the ground pattern layer 401 of the circuit board 400. However, in the case of the ground pattern layer 401, part of the noise is shielded by the metal base plate 300, and therefore a degree of coupling is small in comparison with the metal base plate 300.

In the present embodiment, the metal base plate 300 which is the noise shielding plate has the plurality of connection parts 301a to 301d to be electrically connected to the base plate fixing part 101, and an end part 300a on the power module side of the metal base plate 300 is provided on the power module 10 side more than an end part 401a on the power module side of the ground pattern layer 10. Further, in the plurality of connection parts 301a to 301d, the connection part 301a which is the closest to the end part 300a of the metal base plate 300 is provided on the power module 10 side more than the end part 401a of the ground pattern layer 401.

That is, in regard to distances in a left-right direction (a direction from the power module 10 toward the noise shielding plate) shown in FIG. 3 which has been viewed from above the containing space, when a distance between the power module 10 and the end part 401a of the ground pattern layer 401 is denoted by A, a distance between the power module 10 and the connection part 301a (a fixing position for screw fixing) is denoted by B, distances between the end part 300a of the metal base plate 300 and the connection parts 301a, 301b are denoted by C, D, and a distance between the power module 10 and the end part 300a of the metal base plate 300 is denoted by E, they are set such that all of A>B, C<D, A>E are satisfied. Incidentally, although in FIG. 3, power module side base points of the distances A, B, E are set at a right end (the ground pattern layer 401 side) of the power module 10, the center of the power module 10 may be set as the power module side base points thereof.

As described above, the closer it comes to the power module 10 which is a noise generation source, the larger coupling of the metal base plate 300 with the noise is and the larger the current density of noise current is. The noise current generated in the end part 300a of the metal base plate 300 flows to the connection part 301a which is the closest to the end part 300a as schematically shown by a broken line R1 and flows from the connection part 301a to the chassis ground via the base plate fixing part 101 and the case body 100a.

FIG. 4 are the ones showing comparative examples relative to a configuration shown in FIG. 3. A configuration shown in FIG. 4(a) is an example of a case where they have been configured so as to be A<E. Since also in this case, they are set so as to be A>B, C<D, the noise current flows from the end part 300a of the metal base plate 300 to the connection part 301a which has been arranged on the power module side more than it similarly to the case in FIG. 3. However, since the ground pattern layer 401 extends to the shown left side more than the end part 300a of the metal base plate 300, a current caused by this noise current is generated in the ground pattern layer 401 and a reduction in conduction noise cannot be promoted.

In addition, in a configuration shown in FIG. 4(b), although C<D and A>E are satisfied, they are set so as to be A<B. In this case, the noise current flows from the end part 300a of the metal base plate 300 toward the connection part 301a which is the shortest in current path as shown by a broken line R2. The connection part 301a is arranged on the opposite side of the power module 10 relative to the end part 300a of the metal base plate 300. Therefore, when the noise current flows from the end part 300a of the metal base plate 300 to the connection part 301a like the broken line R2, the noise current flows right under the ground pattern layer 401 and the conduction noise cannot be reduced as in the case in FIG. 4(a).

On the other hand, in the embodiment shown in FIG. 3, since the end part 300a of the metal base plate 300 is located on the power module side more than the end part 401a of the ground pattern layer 401 (A>E), and the connection part 301a which is the closest to the end part 300a of the metal base plate 300 is located on the power module side more than the end part 401a of the ground pattern layer 401 (A>B), the noise current shown by the broken line R1 would flow through a place remote from the ground pattern layer 401. As a result, the conduction noise generated in the ground pattern layer 401 can be reduced. In addition, the noise level of the entire of the board region 400a can be reduced, and a degree of freedom in installation of the connector for signal 60 becomes high.

Incidentally, the end part 401a of the ground pattern layer 401 moves backward from the end part 300a of the metal base plate 300 to a noise shielding region (a region on the shown right side of the end part 300a) of the metal base plate 300 by setting them so as to be A>E. As a result, coupling thereof with the noise in the grand pattern layer 401 can be reduced, and the noise current density in the vicinity of the end part 401a of the ground pattern layer 401 can be reduced.

(First Modification)

Figure 5:
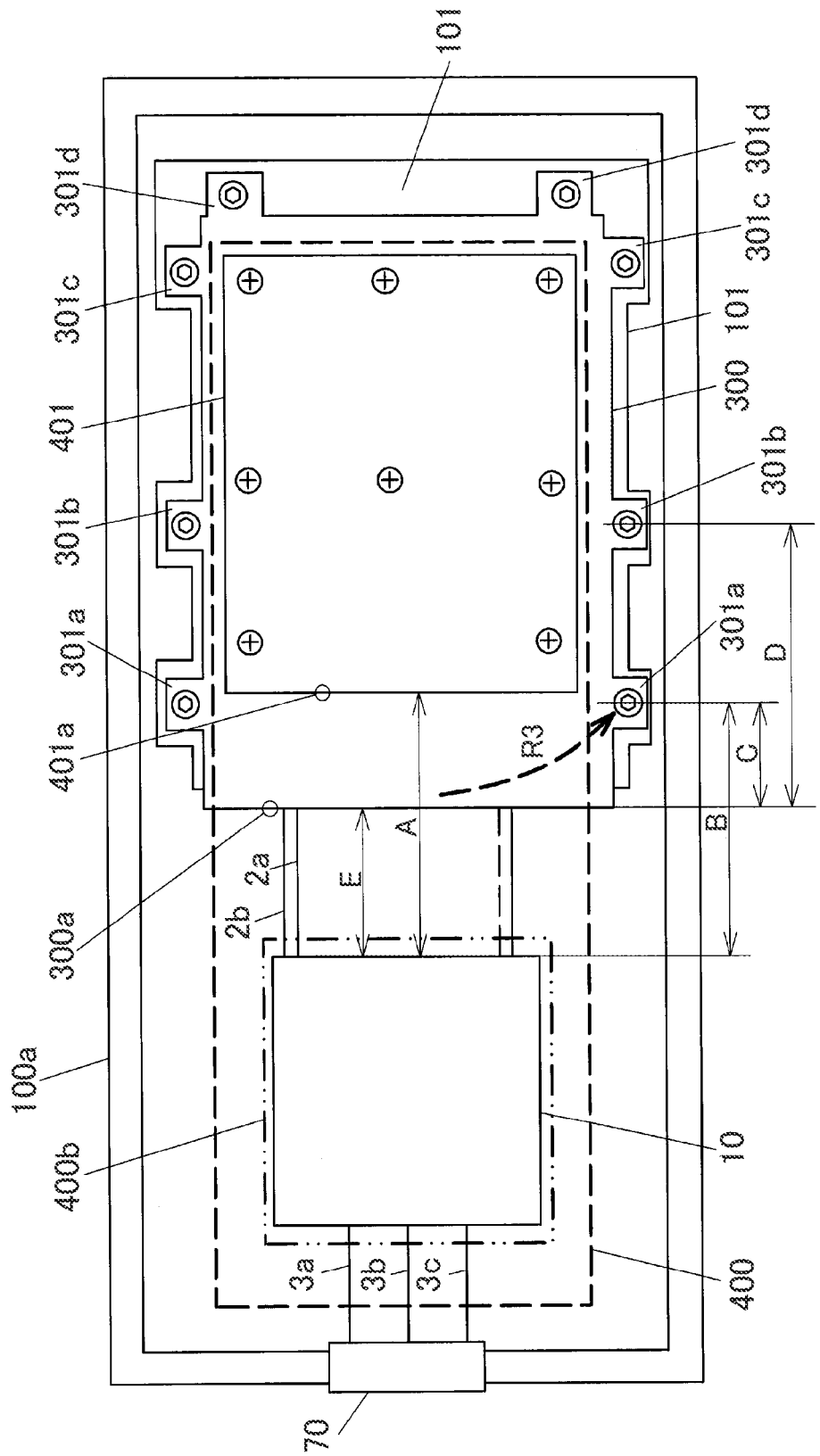
FIG. 5 is a plan view showing a first modification.

FIG. 5 is a diagram showing another example in a case where they have been set so as to be A>B, C<D, A>E. In the example shown in FIG. 5, the connection part 301a which is the closest to the end part 300a of the metal base plate 300 is arranged not on the power module side relative to the end part 300a but on its opposite side (the side away from the power module 10). In this case, a metal base plate region between the end part 300a of the metal base plate 300 and the end part 401a of the ground pattern layer 401 is widened, and the end part 401a of the ground pattern layer 401 can be largely separated from the noise current path as shown by a broken line R3. In addition, direct coupling of the noise to the ground pattern layer 401 can be reduced. As a result, the reduction in conduction noise can be promoted.

(Second Modification)

Figure 6:
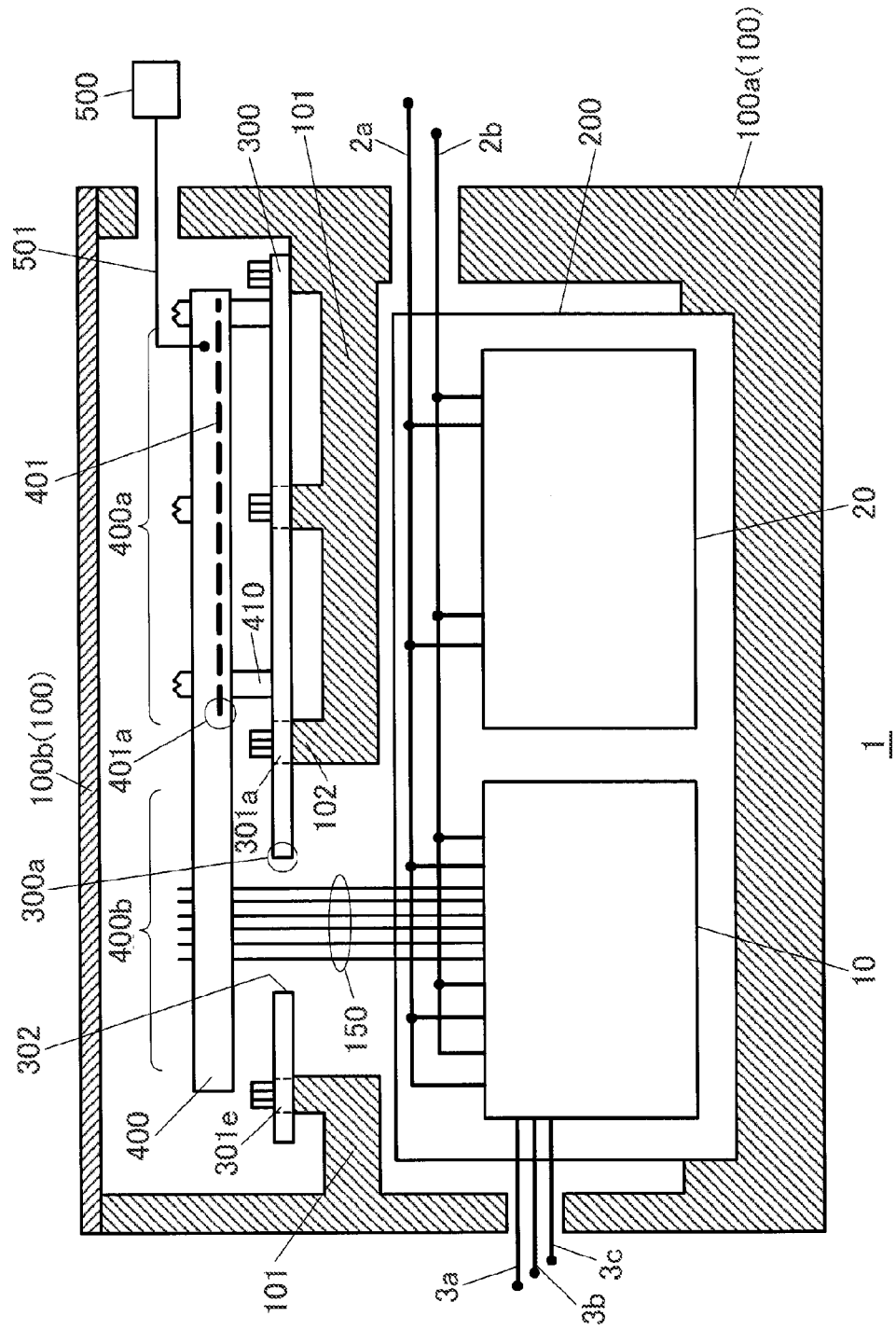
FIG. 6 is a diagram showing a second modification.
Figure 7:
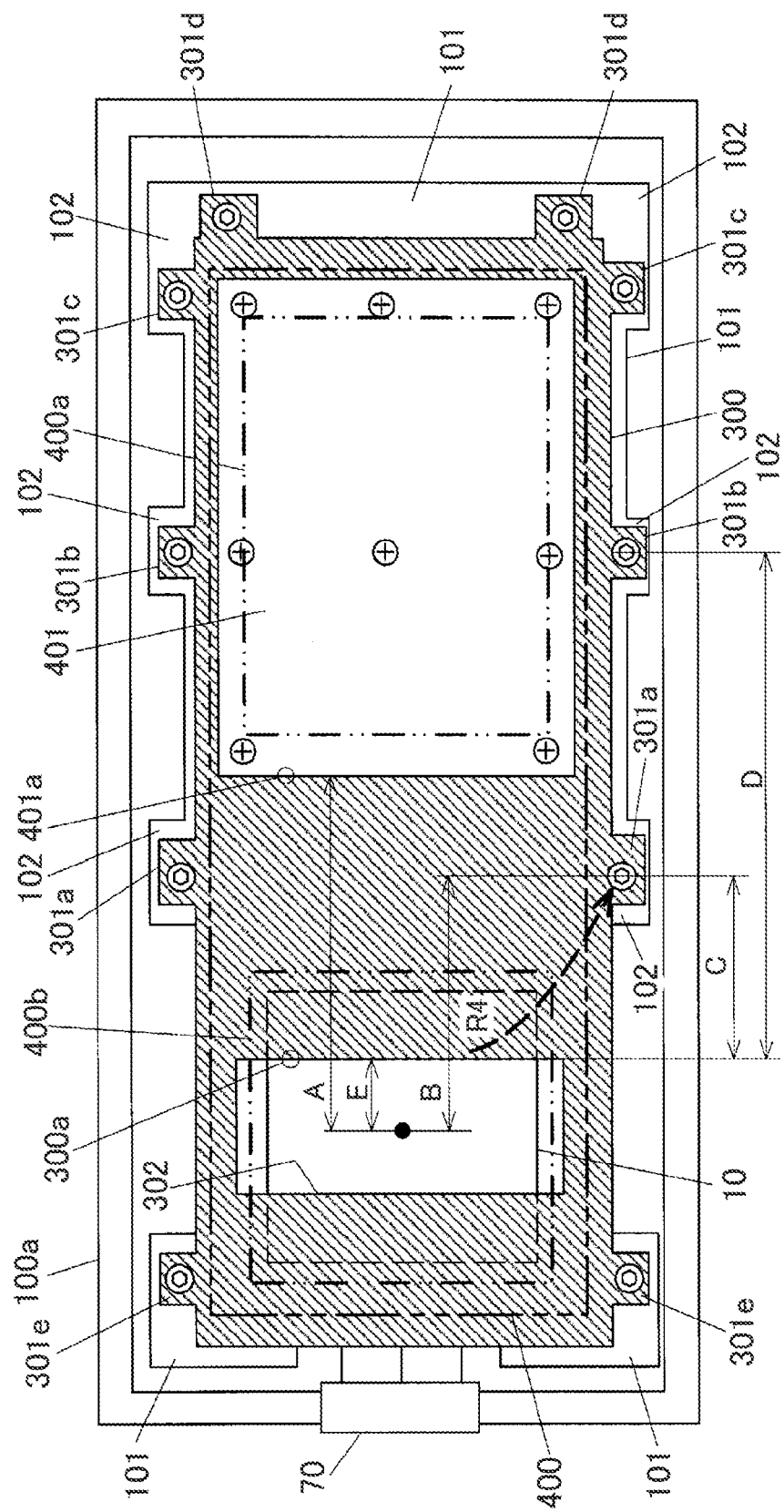
FIG. 7 is a plan view of a power conversion device in the second modification.

FIGS. 6, 7 are diagrams showing the second modification of the present embodiment. Also in this case, the abovementioned conditions A>B, C<D, A>E are satisfied. In the abovementioned example in FIGS. 2, 3, the arrangement region of the metal base plate 300 was limited to a region almost above the capacitor module 20 between the heavy electricity unit 200 and the circuit board 400. On the other hand, in the second modification, as shown in FIGS. 6, 7, the metal base plate 300 was provided over the entire of a region above the heavy electricity unit 200, and an opening 302 through which the gate terminal 150 passes was formed in a region above the power module 10. On the metal base plate 300, a connection part 301e is provided also on the shown left side of the opening 302, and the connection part 301e is fixed to the base plate fixing part 101 of the case body 100a.

An edge of the metal base plate 300 which is present between the board region 400a in which the control circuit 40 is to be mounted and the power module 10 corresponds to the end part 300a of the abovementioned metal base plate 300. Therefore, in the case of the second modification, an edge portion on the ground pattern layer 401 side of the opening 302 is equivalent to the abovementioned end part 300a. The noise current flows from the end part 300a of the metal base plate 300 to the connection part 301a which is the closest to it as shown by a broken line R4. Since the end part 401a of the ground pattern layer 401 is far from the path (the broken line R4) of the noise current, the reduction in conduction noise in the ground pattern layer 401 can be promoted.

In the case of the second modification, since a region between the end part 300a of the metal base plate 300 and the end part 401a of the ground pattern layer 401 is widened as shown in FIG. 7, a noise shielding effect is improved in comparison with the metal base plate 300 shown in FIGS. 2, 3, and the reduction in conduction noise in the circuit board 400 can be improved further.

Incidentally, since in the second modification, the end part 300a of the metal base plate 300 is located at a position above the power module 10, the power module side base points of the distances A, B, E are set on the center of the power module 10.

(Third Modification)

Figure 8:
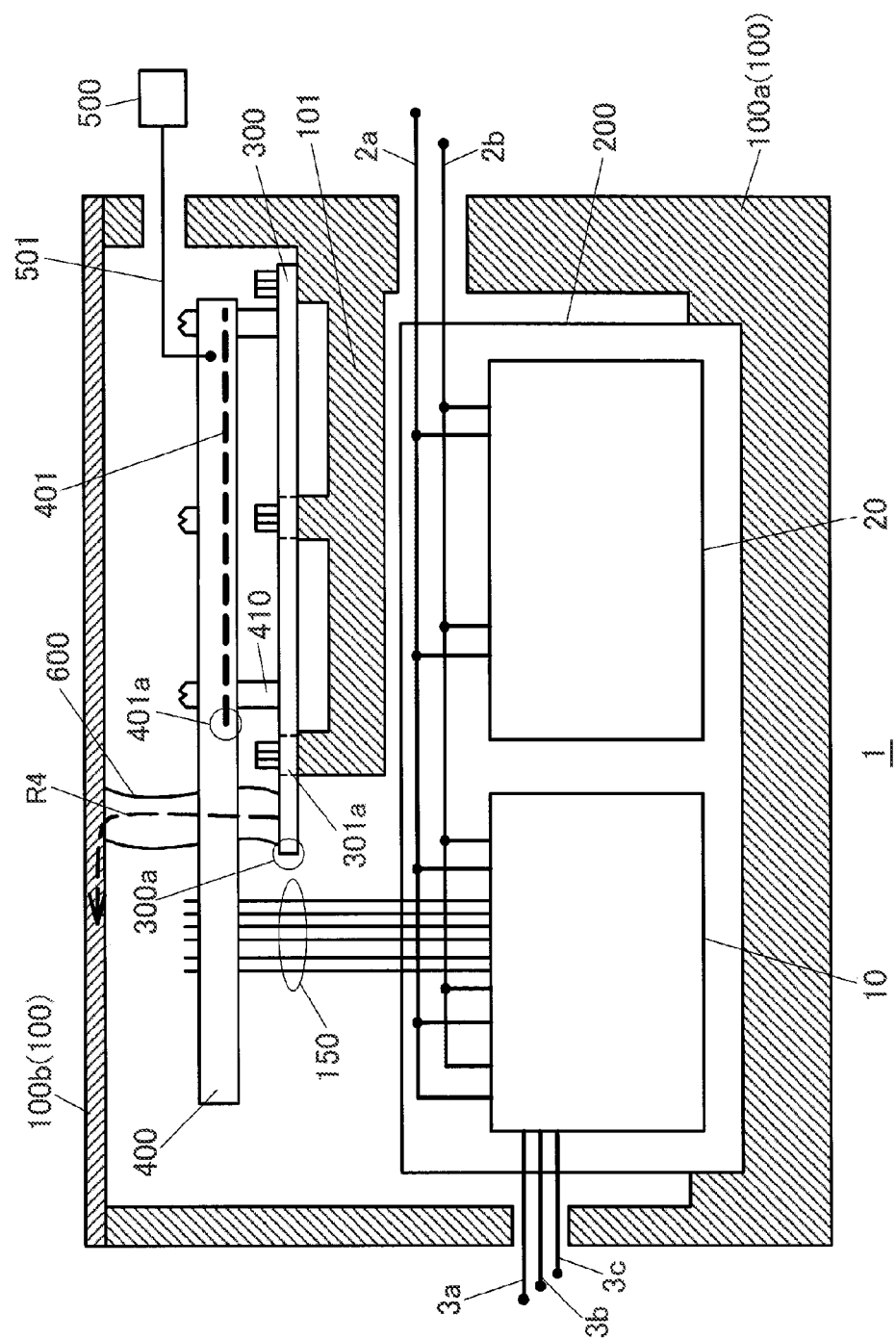
FIG. 8 is a diagram showing a third modification.

FIG. 8 is a diagram showing the third modification of the present embodiment. In the third modification, a metal spring member 600 was added to the configuration shown in FIG. 2. The spring member 600 is provided so as to interpose between the vicinity of the end part 300a of the metal base plate 300 and the cover 100b, a lower end part is pressed against the metal base plate 300 and an upper end part is pressed against the cover 100b. That is, also the spring member 600 functions as a connection part which electrically connects together the metal base plate 300 and the housing 100.

Since a contact position of the spring member 600 with the metal base plate 300 is closer to the end part 300a than it is to the connection part 301a, the noise current in the end part 300a of the metal base plate 300 flows to the cover 100b via the spring member 600 as shown by the broken line R4. Also in this case, since the path (the broken line R4) of the noise current is remote to the end part 401a of the ground pattern layer 401, the conduction noise in the ground pattern layer 401 can be reduced.

For example, in the example shown in FIG. 4(a), the connection part 301a is provided near the end part 300a of the metal base plate 300. However, even in a case where it cannot be made into such a configuration, this spring member 600 functions as the connection part which is the closest to the end part 300a of the metal base plate 300 by providing the spring member 600 in the vicinity of the end part 300a of the metal base plate 300. As a result, the noise current flows through the spring member 600, and the conduction noise in the ground pattern layer 401 can be reduced. Incidentally, although the configuration in FIG. 8 is the one in which the spring member 600 has been added to the configuration shown in FIG. 2, it can also be applied to the configuration shown in FIG. 7 similarly.

In the above-described embodiment, as shown in FIG. 3, the metal base plate 300 for noise shielding has the plurality of connection parts 301a to 301d to be electrically connected to the metal housing 100, and the end part 300a of the metal base plate 300 is provided on the power module 10 side more than the end part 401a of the ground pattern layer 401. Then, in the plurality of connection parts 301a to 301d, the connection part 301a which is the closest to the end part 300a of the metal base plate 300 is provided on the power module 10 side more than the end part 401a of the ground pattern layer 401. The noise current generated in the end part 300a of the metal base plate 300 flows to the connection part 301a through the place remote from the end part 401a of the ground pattern layer 401, and the conduction noise in the ground pattern layer 401 can be reduced by having made them into such a configuration.

In the configuration shown in FIG. 3, the driver circuit 30 is mounted in the region that the power module 10 faces of the circuit board 400 on which the control circuit 40 is mounted. In a case where the driver circuit 30 and the control circuit 40 are provided on the same circuit board 400 in this way, since the driver circuit 30 is provided so as to come close to the power module 10, also the control circuit 40 would be arranged at a position near the power module 10. Accordingly, the reduction in conduction noise can be promoted by configuring the metal base plate 300 and the ground pattern layer 401a as shown in FIG. 3. Incidentally, also in the case of a configuration in which the driver circuit 30 is provided in the power module 10, the configuration of the metal base plate 300 and the ground pattern layer 401a shown in FIG. 3 can be applied similarly.

Incidentally, the above description is absolutely one example, and when interpreting the invention, it is neither limited to nor bound by a corresponding relation between the matters described in the abovementioned embodiment and the matters described in the scope of the patent claims.

The disclosure of the following priority basic application is incorporated herein as the citation.

Japanese Patent Application No. 2014-154101 (filed on Jul. 29, 2014)

LIST OF REFERENCE SIGNS

1 . . . power conversion device, 11, 13 . . . power semiconductor, 80 . . . battery, 10 . . . power module, 20 . . . capacitor module, 30 . . . driver circuit, 40 . . . control circuit, 100 . . . housing, 110 . . . base plate fixing part, 300 . . . metal base plate, 301a to 301e . . . connection part, 400 . . . circuit board, 401 . . . ground pattern layer, 600 . . . spring member

The invention claimed is:

1. A power conversion device comprising:
a capacitor module that smooths a DC current from a DC power source;
a power module that converts the DC current into an AC current based on a drive signal from a drive circuit;
a circuit board that extends up to above the power module and includes a ground layer in a control circuit mounting region of the circuit board, wherein the control circuit mounting region faces the power module;
a noise shielding plate that extends to the control circuit mounting region and includes an opening for wiring that connects together the power module and the drive circuit, wherein the noise shield plate shields noise from the power module; and
a metal housing in which the capacitor module and the power module are contained side by side, the circuit board is contained above the capacitor module, and the noise shielding plate is contained at a position which faces the control circuit mounting region between the circuit board and the capacitor module,
wherein the noise shielding plate has a plurality of connection parts that are electrically connected to the metal housing, a first end part on a power module side of the noise shielding plate is provided on the power module more than a second end part on the power module side of the ground layer and a particular connection part from the plurality of connection parts that is closest to the first end part among the plurality of connection parts is provided on the power module more than the second end part, in planar view viewed from above a containing part of the metal housing, and an edge on a capacitor modules side of the opening is the first end part.

* * * * *